United States Patent
Jiang

(10) Patent No.: US 8,280,936 B2
(45) Date of Patent: Oct. 2, 2012

(54) PACKED RESTRICTED FLOATING POINT REPRESENTATION AND LOGIC FOR CONVERSION TO SINGLE PRECISION FLOAT

(75) Inventor: Hong Jiang, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 1177 days.

(21) Appl. No.: 11/648,265

(22) Filed: Dec. 29, 2006

(65) Prior Publication Data

US 2010/0257221 A1    Oct. 7, 2010

(51) Int. Cl.
G06F 7/00 (2006.01)
G06F 15/00 (2006.01)
G06F 7/38 (2006.01)
H03M 7/00 (2006.01)

(52) U.S. Cl. ............ 708/204; 708/495; 341/95

(58) Field of Classification Search ............ 708/204, 708/208, 490, 495
See application file for complete search history.

(56) References Cited

U.S. PATENT DOCUMENTS

| | | | | |
|---|---|---|---|---|
| 3,872,442 A * | 3/1975 | Boles et al. | | 708/204 |
| 3,961,167 A * | 6/1976 | Mills | | 708/311 |
| 4,189,715 A * | 2/1980 | Duttweiler | | 341/75 |
| 5,161,117 A * | 11/1992 | Waggener, Jr. | | 708/204 |
| 5,523,961 A * | 6/1996 | Naini | | 708/204 |
| 5,805,475 A * | 9/1998 | Putrino et al. | | 708/204 |
| 5,995,122 A * | 11/1999 | Hsieh et al. | | 345/561 |
| 6,289,365 B1 * | 9/2001 | Steele, Jr. | | 708/204 |
| 6,601,079 B1 * | 7/2003 | Phillips | | 708/495 |
| 6,745,319 B1 * | 6/2004 | Balmer et al. | | 712/223 |
| 7,330,864 B2 * | 2/2008 | Yuval et al. | | 708/208 |
| 7,522,173 B1 * | 4/2009 | Berendsen | | 345/604 |
| 2003/0154227 A1 * | 8/2003 | Howard et al. | | 708/495 |
| 2005/0055389 A1 * | 3/2005 | Ramanujam | | 708/204 |

OTHER PUBLICATIONS

Shelburne, Brian; "The Representation of Numbers on the Computer", Class Handout, Wittenberg University, Jan. 2004, retrieved from http://web.archive.org/web/20060828131935/userpages.wittenberg.edu/bshelburne/Comp150/NumbersBriefVersion.pdf.*

Balbanian, Norman and Carlson, Bradley; "Digital Logic Design Principles", John Wiley & Sons, Inc., 2001, pp. 34-63, retrieved from http://www.wiley.com/college/engin/balabanian293512/pdf/ch02.pdf.*

"Mixed Logic", Class Handout for ECE2030—Intro. to Computer Engineering, Georgia Institute of Technology, Spring 2004, retrieved from http://web.archive.org/web/20060911103603/users.ece.gatech.edu/~copeland/jac/2030/pdf/mixed-logic.pdf.*

* cited by examiner

*Primary Examiner* — Chat Do
*Assistant Examiner* — Matthew Sandifer
(74) *Attorney, Agent, or Firm* — Trop, Pruner & Hu, P.C.

(57) ABSTRACT

An apparatus for expanding an immediate vector of restricted data structures may include logic connected to a first memory and a second memory connected to the logic. The first memory may store the immediate vector of restricted data structures that specify distinct floating point numbers. The immediate vector may have a fixed number of bits. The logic may expand the vector of restricted data structures into a number of corresponding expanded data structures that also specify the distinct floating point numbers. Each of the expanded data structures may also have the fixed number of bits. The second memory may store the number of corresponding expanded data structures.

9 Claims, 4 Drawing Sheets

Expanded single precision float

210

| Notation | Numerical Data Types | Fundamental Data Type | Range |
|---|---|---|---|
| F | Single Precision Float | Doubleword | $[-(2-2^{-23})^{127}...-2^{-149}, 0.0, 2^{-149}...(2-2^{-23})^{127}]$ |
| VF | Packed Restricted Float Vector | Doubleword | $[-31...-0.125, 0, 0.125...31]$ |

| Class | Restricted 8-bit Float | | | | Extended 8-bit Exponent | Floating number in decimal |
|---|---|---|---|---|---|---|
| | Hex # | Sign [7] | Exponent [6:4] | Fraction [3:0] | | |
| Positive Normalized Float | 0x70-0x7F | 0 | 111 | 0000 ... 1111 | 1000 0011 | 16 ... 31 |
| | 0x60-0x6F | 0 | 110 | 0000 ... 1111 | 1000 0010 | 8 ... 15.5 |
| | 0x50-0x5F | 0 | 101 | 0000 ... 1111 | 1000 0001 | 4 ... 7.75 |
| | 0x40-0x4F | 0 | 100 | 0000 ... 1111 | 1000 0000 | 2 ... 3.875 |
| | 0x30-0x3F | 0 | 011 | 0000 ... 1111 | 0111 1111 | 1 ... 1.9375 |
| | 0x20-0x2F | 0 | 010 | 0000 ... 1111 | 0111 1110 | 0.5 ... 0.96875 |
| | 0x10-0x1F | 0 | 001 | 0000 ... 1111 | 0111 1101 | 0.25 ... 0.484375 |
| | 0x01-0x0F | 0 | 000 | 0001 ... 1111 | 0111 1100 | 0.125 ... 0.2421875 |
| | 0x00 | 0 | 000 | 0000 | 0000 0000 | 0 (+zero) |
| Negative Normalized Float | 0xF0-0xFF | 1 | 111 | 0000 ... 1111 | 1000 0011 | -16 ... -31 |
| | 0xE0-0xEF | 1 | 110 | 0000 ... 1111 | 1000 0010 | -8 ... -15.5 |
| | 0xD0-0xDF | 1 | 101 | 0000 ... 1111 | 1000 0001 | -4 ... -7.75 |
| | 0xC0-0xCF | 1 | 100 | 0000 ... 1111 | 1000 0000 | -2 ... -3.875 |
| | 0xB0-0xBF | 1 | 011 | 0000 ... 1111 | 0111 1111 | -1 ... -1.9375 |
| | 0xA0-0xAF | 1 | 010 | 0000 ... 1111 | 0111 1110 | -0.5 ... -0.96875 |
| | 0x90-0x9F | 1 | 001 | 0000 ... 1111 | 0111 1101 | -0.25 ... -0.484375 |
| | 0x81-0x8F | 1 | 000 | 0001 ... 1111 | 0111 1100 | -0.125 ... -0.2421875 |
| | 0x80 | 1 | 000 | 0000 | 0000 0000 | -0 (-zero) |

Fig. 2B

PACKED RESTRICTED FLOATING POINT REPRESENTATION AND LOGIC FOR CONVERSION TO SINGLE PRECISION FLOAT

BACKGROUND

Implementations of the claimed invention generally may relate to formats and/or data structures for representing floating point numbers, and logic associated therewith.

In some cases, single precision, floating point numbers may be contained in a 32-it doubleword, taking the format, for example, as defined in the IEEE Standard 754 for Binary Floating-Point Arithmetic. FIG. 1A illustrates such a conventional floating point format 110. As may be seen, format 110 may include one sign bit, eight exponent bits, and 23 fraction bits, for a total of 32 bits. In such format 110, the maximal representable number is $(2-2^{-23})^{127}$ and the minimal number is $-(2-2^{-23})^{127}$. The smallest fractional negative number that may be represented by format 110 is $-2^{-149}$ and the smallest fractional positive number that may be represented is $2^{-149}$. In format 110, the value 0.0 has no fractional parts.

In many applications, the high precision of format 110 may not be required to describe certain sets or classes of numerical data. One such example is an immediate constant ("immediate" being defined and generally understood as an operand within an instruction) used in certain single instruction, multiple data (SIMD) instruction set architectures (ISAs). Hence, there is a need to use fewer bits to represent a floating point value.

BRIEF DESCRIPTION OF THE DRAWINGS

The accompanying drawings, which are incorporated in and constitute a part of this specification, illustrate one or more implementations consistent with the principles of the invention and, together with the description, explain such implementations. The drawings are not necessarily to scale, the emphasis instead being placed upon illustrating the principles of the invention. In the drawings.

FIG. 2A shows a table contrasting the conventional floating point format and the packed, restricted floating point data structure;

FIG. 2B shows a table providing detailed floating point values defined by the restricted floating point data structure;

DETAILED DESCRIPTION

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of the claimed invention. However, it will be apparent to those skilled in the art having the benefit of the present disclosure that the various aspects of the invention claimed may be practiced in other examples that depart from these specific details. In certain instances, descriptions of well known devices, circuits, and methods are omitted so as not to obscure the description of the present invention with unnecessary detail.

Figure 1A:
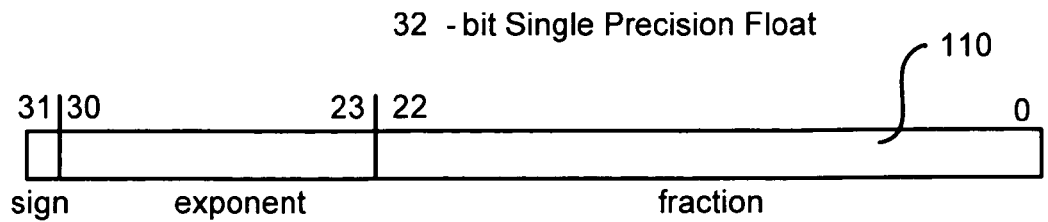
FIG. 1A illustrates a conventional floating point format.
Figure 1B:
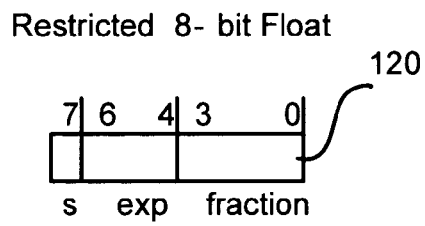
FIG. 1B illustrates a restricted floating point data structure.

FIG. 1B illustrates a restricted, 8-bit floating point data structure 120. Data structure 120 is "restricted" in both bit length and numerical precision relative to format 110 in FIG. 1A, as will be further explained below. Restricted data structure 120 may include one sign bit, three exponent bits, and four fraction bits, for a total of eight bits. As will be explained in further detail below, the sign bit may take on one of two values, 0 or 1. The exponent bits may take on any of eight values, 000 to 111, inclusive. The fraction bits may take on any of sixteen values, 0000 to 1111 inclusive.

The restricted floating point structure 120 can describe a restricted set of floating point values in 8-bits relative to the set specified by format 110. Restricted structure 120, however, only occupies one quarter of the bit space for a given floating point number (e.g., an immediate value in an SIMD instruction). Thus, the same 32-bit field (or physical and/or logical storage area) that would otherwise describe a single floating point value may be used to hold a 4-wide, floating point vector with four 8-bit structures 120.

Figure 1C:
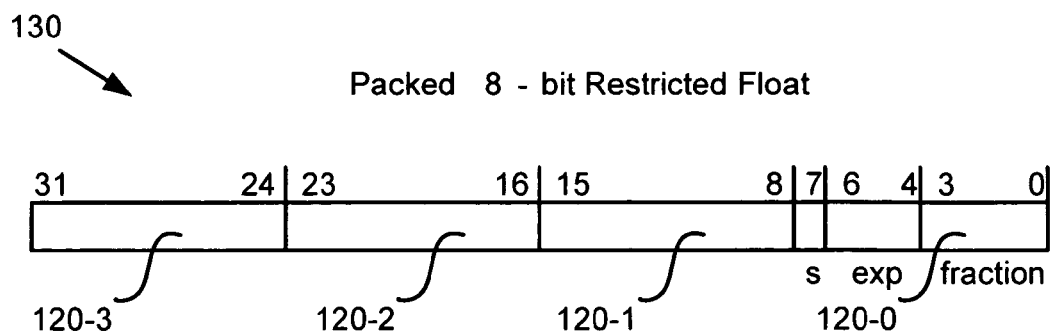
FIG. 1C illustrates a packed, restricted floating point data structure.

FIG. 1C illustrates a packed, 32-bit restricted floating point data structure 130. Data structure 130 may contain four different 8-bit data structures 120-0 to 120-3 (collectively "structures 120" or "vector 120"). Each of structures 120 may include the 8-bit structure described with regard to FIG. 1B. Although this 8-bit structure is only explicitly shown for structure 120-0, it is also present in each of 8-bit data structures 120-1 to 120-3 occupying the last 24 bits of packed structure 130. Hence vector 120 including four restricted floating point values may fit within structure 130 that would otherwise be able to accommodate a single conventional floating point format 110.

Although four adjacent, separate structures 120 are shown in FIG. 1C, it should be understood that these structures 120 do not necessarily have to be arranged as shown. Bits from different structures 120 may be interleaved, if desired, in some implementations. Like bits (e.g., the four sign bits) may be grouped, if desired, in some implementations. The bit ordering and/or arrangement within data structure 130 may be chosen as convenient for the four 8-bit structures 120 packed therein.

FIG. 2A shows a table 210 contrasting the conventional floating point format 110 and the packed, restricted floating point data structure 130. Format 110, summarized in the first row of table 210, is a single precision float data type having a doubleword (32 bit) length. Format 110 may range from $(2-2^{-23})^{127}$ to $-(2-2^{-23})^{127}$, with the smallest nonzero numbers being $-2^{-149}$ and $2^{149}$. Packed structure 130, summarized in the second row of table 210, is a packed restricted float vector data type (i.e., including four floating point values) also having a doubleword (32 bit) length. Packed structure 130 may range from 31 to −31, with the smallest nonzero numbers being −0.125 and 0.125. It should be noted, however, that this range is applicable to each of the four, possibly distinct, floating point values in packed structure 130.

FIG. 2B shows a table 220 providing detailed floating point values defined by the restricted floating point data structure 120. The pattern in table 220 is consistent to that of the single precision floating point values defined in the IEEE Standard 754 for Binary Floating-Point Arithmetic. As may be seen from table 220, the four, $0^{th}$ through $3^{rd}$, fraction bits of the restricted, 8-bit float structure 120 may range from 0000 to 1111 for each of the eight exponent values. As may also be seen from table 220, the three, $4^{th}$ through $6^{th}$, exponent bits of the restricted, 8-bit float structure 120 may be expanded to an extended, 8-bit exponent, like that of format 110. Table 220 shows that the three exponent bits of the restricted, 8-bit float structure 120 define the most significant bit and the two least significant bits (shown in bold) of such extended, 8-bit exponent.

Data structure 120 defines sixteen floating point numbers for each of eight exponent values, for a total of 128 different floating point numbers specified by the exponent and fraction bits. Each of these 128 values appears in both the positive and negative ranges, as specified by the sign bit, for a total of 256 different numbers specified by the 8-bit restricted data structure 120.

Figure 3:
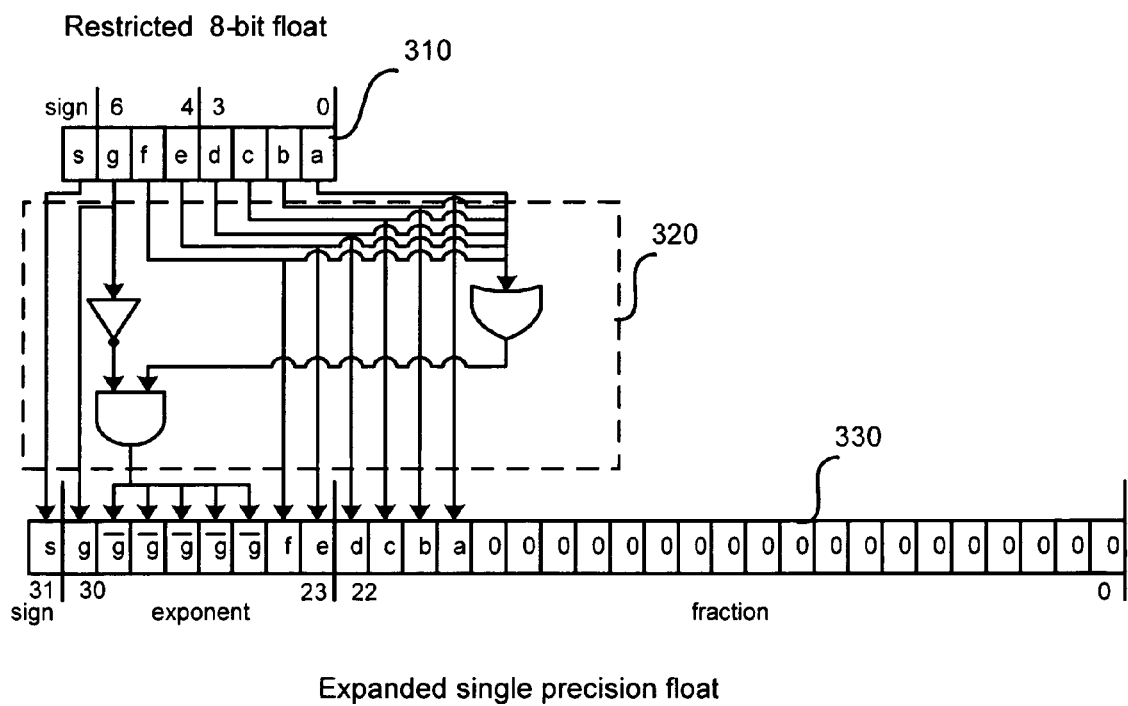
FIG. 3 illustrates an apparatus for converting the restricted floating point data structure to an expanded single precision float structure.

FIG. 3 illustrates an apparatus for converting the restricted floating point data structure 120 to an expanded single precision float structure. The apparatus may include an 8-bit buffer 310, logic 320, and a 32-bit buffer 330. Buffer 310 may include any memory or other tangible computer-readable medium capable of storing eight bits. In some implementations, buffer 310 may be a physically separate device, but in some implementations, buffer 310 may be a physically and/or logically partitioned portion of a larger memory device. As shown in FIG. 3, buffer 310 may include an 8-bit data structure including a sign bit "s," three exponent bits "gfe," and four fraction bits "dcba," in most-to-least significant order.

It should be noted that buffer 310 and buffer 330 may be thought of as but one example of the input and output of logic 320. In some implementations, buffers 310 and/or 330 may not exist as such. For example, the apparatus in FIG. 3 (including logic 320) may be part of a FPU (Floating Point Processing Unit) in an implementation. In such a case, the output of logic 320 may go directly to a multiplier or adder of the FPU. In this vein, logical locations (e.g., a multiplier or adder) capable of providing or receiving, however temporarily, a restricted or expanded data structure may be referred to herein as a "memory" for convenience. To the extent the word "memory" implies storage, however, buffer 310 may be more generally conceptualized as a circuitry "source" of restricted floating point data structure 120, and buffer 330 may be more generally conceptualized as a circuitry "destination" of the expanded single precision float structure.

Logic 320 may include logical devices capable of expanding the restricted floating point data structure 120 to a corresponding single precision float structure. Logic 320 may be implemented via any number of transistor-based designs, but the invention is not limited thereto. In one implementation, logic 320 may include one AND gate, one OR gate, and one inverter arranged as shown in FIG. 3.

Buffer 330 may include any memory or other tangible computer-readable medium capable of storing 32 bits. In some implementations, buffer 330 may be a physically separate device, but in some implementations, buffer 330 may be a physically and/or logically partitioned portion of a larger memory device. As shown in FIG. 3, buffer 330 may include a 32-bit data structure similar to format 110 including a sign bit, eight exponent bits, and 23 fraction bits.

As may be seen from FIG. 3, the sign bit in buffer 330 may be input directly from the corresponding sign bit "s" in buffer 310. Similarly, the most significant exponent bit and two least significant exponent bits in buffer 330 may be input directly from the corresponding exponent bits "gfe" in buffer 310. The five exponent bits in buffer 330 between the most significant bit and the second-to-least significant bit may be generated by logic 320 as the inverse of exponent bit "g."

The four most significant fraction bits in buffer 330 may be input directly from the corresponding exponent bits "dcba" in buffer 310. The remaining fraction bits in buffer 330 may be set to zero by any suitable manner. In this way, a relatively compact logic 320 may expand the restricted structure 120 into a corresponding, expanded single precision floating point structure that is bit-compatible with format 110.

Figure 4:
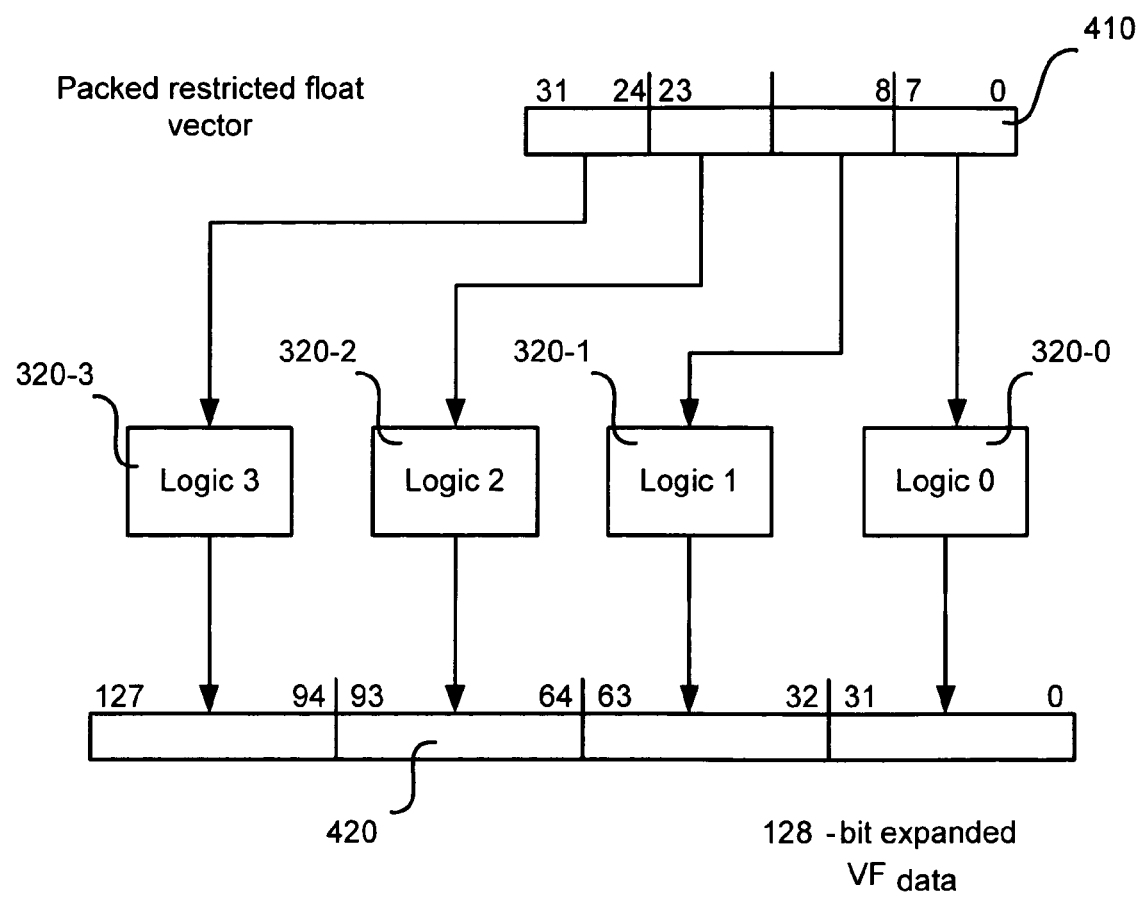
FIG. 4 illustrates an apparatus for converting the packed, restricted floating point data structure to four expanded, single precision float structures.

FIG. 4 illustrates an apparatus for converting the packed, restricted floating point data structure 130 to four expanded, single precision float structures. The apparatus in FIG. 4 performs a similar task to the apparatus in FIG. 3, but for a 4-wide packed structure 130 instead of an 8-bit restricted data structure. The apparatus may include a 32-bit buffer or memory 410 that includes packed structure 130, four logics 320-0 to 320-3, and a 128-bit buffer or memory 420. Each of logics 320-0 to 320-3 may be arranged as logic 320 in FIG. 3 (e.g., including 3 logic gates), and the four, 8-bit restricted structures 120 in packed structure 130 within buffer 410 may be expanded to four corresponding 32-bit expanded single precision floating point structures within buffer 420.

With reference to FIG. 4, a 32-bit data field in buffer 410 may contain four restricted floating point values 120. This is a useful data representation particularly for and within SIMD ISA. In such an ISA, a 32-bit data field may be present in an instruction word representing a single-precision scalar value. However, such a word may also be used to represent a 4-wide vector of restricted float 130. Relatively modest hardware may convert such a vector 130 into 4 single-precision floats (e.g., in buffer 420) using the above mentioned circuitry 320-0 to 320-3. This is an important step in using such kind of immediate vector 130, because it allows a floating point processing unit (FPU) in such a SIMD ISA to be agnostic to the restricted data type 120/130.

The above-described structures and apparatuses may advantageously provide a vector immediate (e.g., packed structure 130) in an SIMD instruction. This data packing may help to improve the performance of such SIMD ISA. Also, the 32-bit restricted 4-wide float vector 130 may be inline in the a single instruction word. This may be used in certain SIMD ISAs (e.g., graphics shaders, etc.) to improve their performance.

The foregoing description of one or more implementations provides illustration and description, but is not intended to be exhaustive or to limit the scope of the invention to the precise form disclosed. Modifications and variations are possible in light of the above teachings or may be acquired from practice of various implementations of the invention.

For example, although the above scheme has been described for 8-bit structures that may be packed into 32-bit structures, the concepts herein are certainly applicable to longer "standard-size" floating point structures. If, as some point, floating point numbers are represented by, or packed into, longer data structures (e.g., 64 bits, 128 bits, etc.), a correspondingly greater number of 8-bit data structures 120 may be packed into those longer data structures.

No element, act, or instruction used in the description of the present application should be construed as critical or essential to the invention unless explicitly described as such. Also, as used herein, the article "a" is intended to include one or more items. Variations and modifications may be made to the above-described implementation(s) of the claimed invention without departing substantially from the spirit and principles of the invention. All such modifications and variations are intended to be included herein within the scope of this disclosure and protected by the following claims.

What is claimed:

1. An apparatus comprising:
a memory to store eight bit floating point data structures, each of said eight bit floating point data structures including one sign bit, three exponent bits, and four fraction bits; and
logic to populate exponent bits of an expanded data structure with multiple instances of an inversion of an exponent bit not having a value of zero in one of the eight bit floating point data structures unless a group of remaining bits of the one of eight bit floating point data structures all have a value of zero, and to populate the exponent bits of the expanded data structure with multiple instances of an inversion of an exponent bit having a value of zero in one of the eight bit floating point data structures unless the group of remaining bits of the one of eight bit floating point data structures all have the value of zero, the logic including:
an inverter with an input of one of the three exponent bits of the eight bit floating point data structure;
an OR gate with inputs of a remaining two of the three exponent bits and the four fraction bits of the eight bit floating point data structure; and
an AND gate with inputs of an output of the inverter and an output of the OR gate.

2. The apparatus of claim 1, wherein, in each of the eight bit floating point data structures, the sign bit occupies a most significant bit, and the four fraction bits occupy four least significant bits.

3. The apparatus of claim 1, wherein each of the eight bit floating point data structures specifies one of 256 different floating point numbers ranging from about −31 to 31.

4. The apparatus of claim 1, wherein the expanded data structure consists of:
one sign bit,
eight exponent bits, and twenty-three fraction bits.

5. The apparatus of claim 1, wherein the memory to store eight bit floating point data structures comprises a thirty-two bit memory buffer storing four different eight bit floating point data structures.

6. The apparatus of claim 5, further comprising:
a 128 bit memory buffer storing four different expanded data structures, the four different expanded data structures resulting from expanding the four different eight bit floating point data structures.

7. A method comprising:
storing an eight bit floating point data structure in a memory, said eight bit floating point data structure including one sign bit, three exponent bits, and four fraction bits;
populating, using a digital logic circuit, exponent bits of an expanded data structure with multiple instances of an inversion of an exponent bit not having a value of zero in the eight bit floating point data structure unless a group of remaining bits of the eight bit floating point data structure all have a value of zero, comprising:
providing a most significant bit of the three exponent bits of the data structure to an input of an inverter of the digital logic circuit;
providing two least significant bits of the three exponent bits and the four fraction bits of the data structure to inputs of an OR gate of the digital logic circuit; and
providing an output of the inverter and an output of the OR gate to inputs of an AND gate of the digital logic circuit.

8. The method of claim 7 further comprising:
providing an output of the AND gate to second, third, fourth, fifth, and sixth most significant bits of eight exponent bits of the expanded data structure.

9. The method of claim 8 further comprising:
transferring the most significant bit of the three exponent bits of the data structure to a most significant bit of the eight exponent bits of the expanded data structure; and
transferring the two least significant bits of the three exponent bits of the data structure to two least significant bits of the eight exponent bits of the expanded data structure.

* * * * *